United States Patent
Chu et al.

(10) Patent No.: US 7,759,139 B2
(45) Date of Patent: Jul. 20, 2010

(54) METHOD FOR MANUFACTURING SILICON DEVICE

(75) Inventors: Shucheng Chu, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/892,419

(22) Filed: Aug. 22, 2007

(65) Prior Publication Data

US 2008/0050856 A1 Feb. 28, 2008

(30) Foreign Application Priority Data

Aug. 24, 2006 (JP) .............................. P2006-227999

(51) Int. Cl.
*H01L 21/00* (2006.01)

(52) U.S. Cl. .................... 438/21; 257/86; 257/E33.018

(58) Field of Classification Search ................. 257/103, 257/E33.015, E33.017, E33.018, 86; 438/21
See application file for complete search history.

(56) References Cited

U.S. PATENT DOCUMENTS

| | | | | |
|---|---|---|---|---|
| 5,308,792 A | * | 5/1994 | Okabayashi et al. | ........ 438/618 |
| 5,726,464 A | * | 3/1998 | Kumomi et al. | ............. 257/103 |
| 6,020,267 A | * | 2/2000 | Liaw et al. | ................... 438/694 |
| 2001/0002510 A1 | * | 6/2001 | Hsu | ............................. 29/852 |
| 2006/0240640 A1 | * | 10/2006 | Nesterenko et al. | ......... 438/455 |
| 2008/0001139 A1 | * | 1/2008 | Augusto | ...................... 257/13 |

FOREIGN PATENT DOCUMENTS

JP  8-139359  5/1996

OTHER PUBLICATIONS

Surma et al. "Photoluminescence from Porous Structures Prepared by Anodization of Annealed Cz-Si," Crystal Res. Technol., 34, 689-697,1999.*
Misiuk et al. "PhotoLuminescence from pressure-annealed nanostructured silicon dioxiode and nitride films," Nanostructured Films and coating NATO Science series p. 157-170, 2000.*

* cited by examiner

*Primary Examiner*—Davienne Monbleau
*Assistant Examiner*—Matthew Reames
(74) *Attorney, Agent, or Firm*—Drinker Biddle & Reath LLP

(57) ABSTRACT

A method for manufacturing a silicon device includes steps of: forming a silicon layer 4*a* that indicates a second conductivity type on a first surface S1*a* of a silicon substrate 2*a* that indicates a first conductivity type; and exposing, after the step, a third surface S3*a* of the silicon layer 4*a* for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa.

5 Claims, 11 Drawing Sheets

METHOD FOR MANUFACTURING SILICON DEVICE

BACKGROUND OF THE INVENTION

1. Field of the Invention

The present invention relates to a method for manufacturing a silicon device.

2. Related Background Art

Conventionally, various methods for improving physical properties possessed by a silicon material, such as a single-crystal silicon substrate, have been developed. For example, as is described in Patent Document 1 (Japanese Published Unexamined Patent Application No. H08-139359), there is known a processing method in which single crystal silicon is anodized in a hydrofluoric acid solution to form a porous state on the silicon surface, and other similar methods. With this processing method, a porous silicon of which emission intensity of a visible light is higher than that of the single crystal silicon (which emits very weak light of 1.13 µm at room temperature) is obtained. Therefore, the formation of the porous silicon leads to implementation of improvement in the light-emission intensity, which is one of the physical properties possessed by the silicon.

SUMMARY OF THE INVENTION

However, the treatment process for improving the light-emission intensity of the silicon material is not a simple process as in the case of manufacturing the porous silicon or the like. Therefore, it is an object of the present invention to provide a method for manufacturing a silicon device, in which an improvement in physical properties such as a light-emission intensity can be implemented by a simple treatment process.

A method for manufacturing a silicon device of the present invention includes steps of: forming a silicon layer that indicates a second conductivity type on a surface of a silicon material that indicates a first conductivity type; and exposing, after the step, a surface of the silicon layer for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa. It may be possible that the silicon material includes a silicon area arranged on the surface of the silicon material and having a thickness inwardly of the silicon material from the surface, and the silicon area is formed of porous silicon or beta iron silicide.

Thus, after the silicon layer that indicates a second conductivity type is formed on the surface of the silicon material of the first conductivity type, argon is added from the surface of the silicon layer. As a result of intensive studies, the inventor found that when the argon is added by exposing the surface of the silicon layer for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa, an intensity of a light emission of a photo luminescence (PL) (PL intensity) is improved, as compared to a case where no argon is added. Furthermore, the inventor also found that when a bias voltage is applied between the silicon material of the first conductivity type and the silicon layer of the second conductivity type, an intensity of a light emission of an electric luminescence (EL) (EL intensity) is improved, as compared to a case where no argon is added. Therefore, according to the present invention, the EL intensity and the PL intensity of the silicon material are improved by a simple treatment process in which the surface of the silicon layer is exposed for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa.

A method for manufacturing a silicon device of the present invention includes steps of: exposing a surface of a silicon material that indicates a first conductivity type for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa; and forming, after the step, a silicon layer that indicates a second conductivity type on the surface of the silicon material. It may be possible that the silicon material includes a silicon area arranged on the surface of the silicon material and having a thickness inwardly of the silicon material from the surface, and the silicon area is formed of porous silicon or beta iron silicide.

Thus, the argon is added from the surface of the silicon material of the first conductivity type. After the argon is added, the silicon layer of the second conductivity type is formed on the surface of the silicon material. As a result of intensive studies, the inventor found that when the argon is added by exposing the surface of the silicon material for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa, the PL intensity is improved as compared to a case where no argon is added. Furthermore, the inventor also found that when a bias voltage is applied between the silicon material of the first conductivity type and the silicon layer of the second conductivity type, the EL intensity is improved as compared to a case where no argon is added. Therefore, according to the present invention, the EL intensity and the PL intensity of the silicon material are improved by a simple treatment process in which the surface of the silicon material is exposed for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa.

A method for manufacturing a silicon device of the present invention includes a step of exposing a surface of a silicon material for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa. It may be possible that the silicon material includes a silicon area arranged on the surface of the silicon material and having a thickness inwardly of the silicon material from the surface, and the silicon area is formed of porous silicon or beta iron silicide.

Thus, the argon is added from the surface of the silicon material. As a result of intensive studies, the inventor found that when the argon is added by exposing the surface of the silicon material for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa, the PL intensity is improved as compared to a case where no argon is added. Therefore, according to the present invention, the PL intensity of the silicon material is improved by a simple treatment process in which the surface of the silicon material is exposed for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa.

According to the present invention, it is possible to implement an improvement in physical properties such as a light-emission intensity by a simple treatment process.

DESCRIPTION OF THE PREFERRED EMBODIMENTS

Figure 1A:
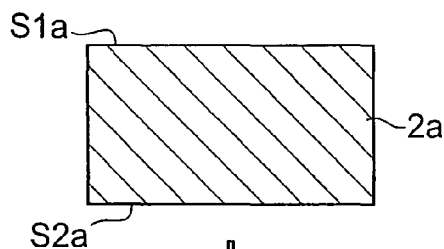
FIG. 1A, FIG. 1B, FIG. 1C, FIG. 1D, and FIG. 1E are cross-sections of a device for describing a method for manufacturing a silicon semiconductor device according to an embodiment.

Hereinafter, with reference to the drawings, a semiconductor device, which is one example of a preferred embodiment, to which the present invention is applied will be described in detail. It is noted that in the descriptions of the drawings, identical components are designated by the same reference numerals so that overlapping description may be omitted, where possible.

First Embodiment

With reference to FIG. 1A, FIG. 1B, FIG. 1C, FIG. 1D, FIG. 1E, and FIG. 1F, a method for manufacturing a silicon device according to a first embodiment will be described. A silicon device according to the first embodiment is a silicon semiconductor device 1a. First, a silicon substrate 2a (silicon material) is prepared (FIG. 1A). The silicon substrate 2a includes a first surface S1a and a second surface S2a opposite the first surface S1a.

Figure 1B:
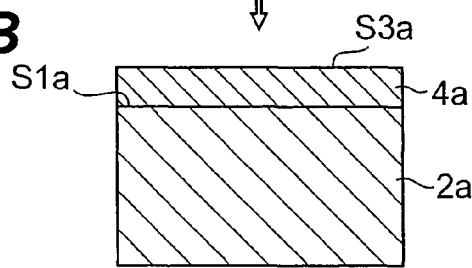

Subsequently, a silicon layer 4a is formed on the first surface S1a of the silicon substrate 2a (FIG. 1B). The silicon layer 4a contains impurities that indicate a second conductivity type different from a first conductivity type. A pn junction portion is formed by the silicon substrate 2a and the silicon layer 4a. The silicon layer 4a includes a third surface S3a opposite a junction surface with the silicon substrate 2a. The thickness of the silicon layer 4a is approximately 50 nm to several μm. In the first embodiment, the first conductivity type is an n-type and the second conductivity type is a p-type. However, the first conductivity type may be the p-type and the second conductivity type may be the n-type.

Figure 1C:
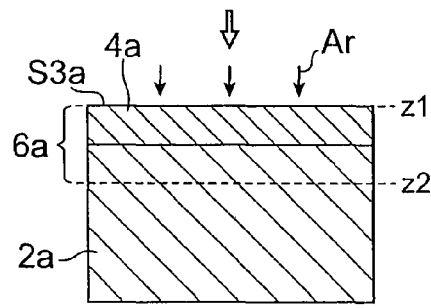

By using an HIP (Hot Isostatic Pressing) device, argon is then added from the third surface S3a of the silicon layer 4a. In this case, the silicon substrate 2a is mounted on a substrate-loading base within the HIP device. The second surface S2a of the silicon substrate 2a is in contact with the surface of the base. The third surface S3a is then exposed for 30 minutes to 6 hours to an argon-containing atmosphere which is adjusted to temperatures of 400° C. to 900° C. and pressures of 4 MPa to 200 MPa. Thereby, the argon is added from the third surface S3a. The addition of the argon forms an argon added area 6a (FIG. 1C). Argon adding conditions are: under the argon atmosphere, pressures of 4 MPa to 200 MPa; temperatures of 400° C. to 900° C.; and a processing time of 30 minutes to 6 hours. The argon added area 6a is formed in a semiconductor area formed of the silicon substrate 2a and the silicon layer 4a. The argon added area 6a is formed from the third surface S3a of the silicon layer 4a to the inside of the above-described semiconductor area.

Figure 1F:
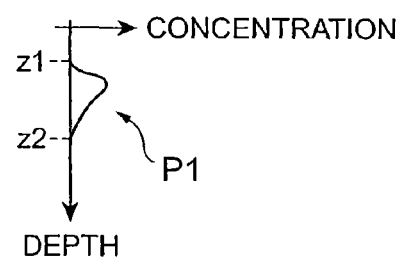
FIG. 1F is a graph showing a concentration distribution in a depth direction.

In FIG. 1F, an argon concentration profile in the argon added area 6a is shown (see reference numeral P1 in the graph). The argon is distributed from an exposed-surface position z1 of the silicon layer 4a to a depth position z2 within the silicon substrate 2a. In an example shown in this argon concentration profile, the argon added area 6a reaches from the third surface S3a of the silicon layer 4a to the interior of the silicon substrate 2a. The argon added area 6a includes an area indicating an argon concentration of $1 \times 10^{18}$ cm$^{-3}$ to $2 \times 10^{20}$ cm$^{-3}$. The argon added area 6a preferably includes an area indicating an argon concentration of $2 \times 10^{18}$ cm$^{-3}$ to $1 \times 10^{20}$ cm$^{-3}$. As a method for adding the argon, any method such as an ion implantation method, a sputtering method, or the like, may be used.

Figure 1D:
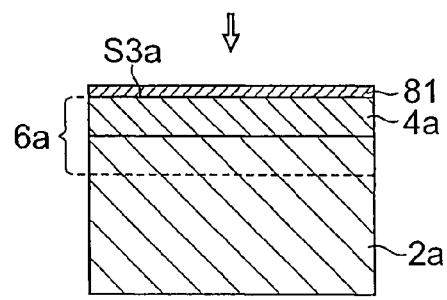

Subsequently, a passivation film 81 is formed on the third surface S3a of the silicon layer 4a (FIG. 1D). A passivation film 8a is a silicon oxide film, for example. Subsequently, a contact hole H1a is arranged in this passivation film 81 to form the passivation film 8a, and a second electrode 14a is formed on the passivation film 8a and a first electrode 12a is formed on the second surface S2a of the silicon substrate 2a. The first electrode 12a and the second electrode 14a are made of a conductive metal (aluminum or the like, for example).

Figure 1E:
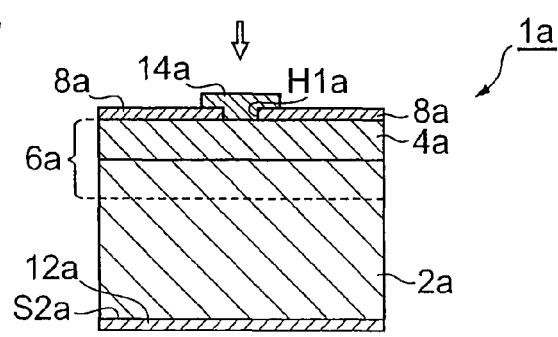

Thereafter, through a process such as dicing, the silicon semiconductor device 1a is manufactured (FIG. 1E).

Figure 2A:
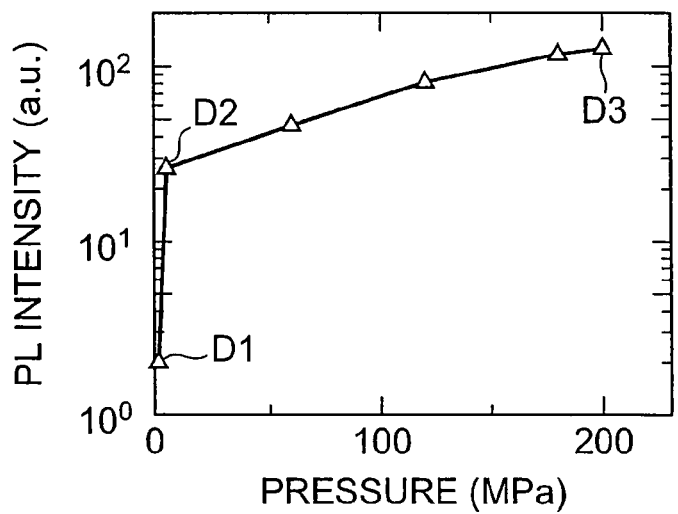
FIG. 2A, FIG. 2B, and FIG. 2C are graphs for describing argon adding conditions according to the embodiment.
Figure 2B:
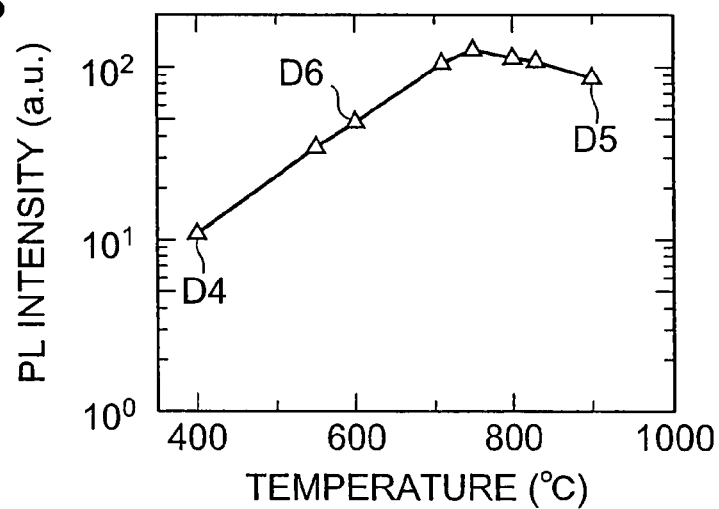
Figure 2C:
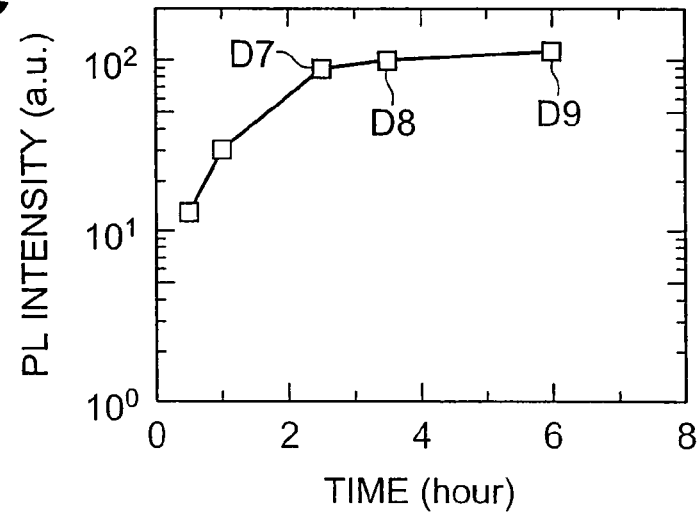

FIGS. 2A, 2B, and 2C show a correlation between the argon adding conditions (pressure, temperature, and processing time) and a PL intensity. FIG. 2A shows a correlation between the pressure in the argon atmosphere and the PL intensity under argon adding conditions in which a temperature is approximately 800° C. and a processing time is approximately 6 hours. A horizontal axis of the graph shown in FIG. 2A represents a pressure (MPa), and a vertical axis represents a PL intensity (arb. units). As shown in FIG. 2A, when the PL intensity in a case where the pressure is approximately as high as an atmospheric pressure is "2" (units) (see data of reference numeral D1 in the graph), if the argon is added under argon adding conditions in which a temperature is approximately 800° C.; pressures are approximately 4 MPa (see data of reference numeral D2 in the graph) to 200 MPa (see data of reference numeral D3 in the graph) (or a pressure is 4 MPa or more); and a processing time is approximately 6 hours, the PL intensity increases by approximately 13 times to 63 times, as compared to a case where the pressure is approximately as high as the atmospheric pressure. According to the data shown in FIG. 2A, when the pressure becomes higher, the PL intensity increases as well.

FIG. 2B shows a correlation between the temperature in the argon atmosphere and the PL intensity under argon adding conditions in which a pressure is approximately 180 MPa and a processing time is approximately 6 hours. A horizontal axis of the graph shown in FIG. 2B represents a temperature (Celsius), and a vertical axis thereof represents a PL intensity (arb. units). As shown in FIG. 2B, the argon is preferably added under argon adding conditions in which temperatures are approximately 400° C. (see data of reference numeral D4 in the graph) to approximately 900° C. (see data of reference numeral D5 in the graph) (or a temperature is 400° C. or more); a pressure is approximately 180 MPa; and a processing time is approximately 6 hours. The argon is more preferably added under argon adding conditions in which temperatures are approximately 600° C. (see data of reference numeral D6 in the graph) to approximately 900° C. (see data of reference numeral D5 in the graph); a pressure is approximately 180 MPa; and a processing time is approximately 6 hours.

FIG. 2C shows a correlation between the processing time and the PL intensity under argon adding conditions in which a pressure is approximately 180 MPa and a temperature is approximately 800° C. A horizontal axis of the graph shown in FIG. 2C represents a processing time (hour), and a vertical axis thereof represents a PL intensity (arb. units). According to the data shown in FIG. 2C, under the argon adding conditions in which a temperature is approximately 800° C. and a pressure is approximately 180 MPa, if the processing time becomes longer, the PL intensity increases as well. In particular, when the processing time is 2 hours or longer (see each piece of data of reference numerals D7, D8, and D9 in the graph), the PL intensity is high.

Figure 3A:
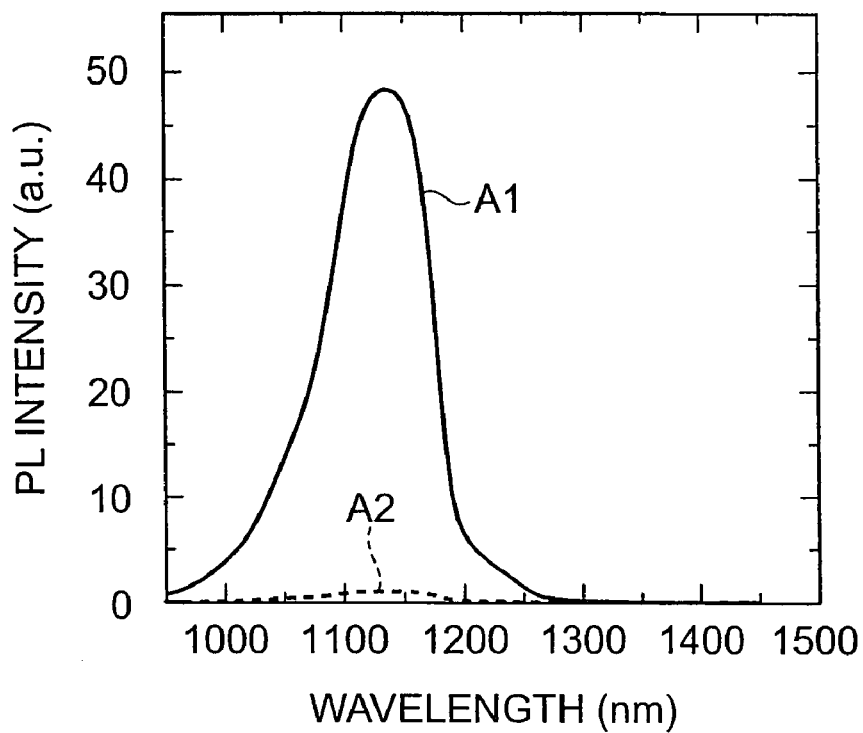
FIG. 3A and FIG. 3B are graphs showing light-emission characteristics of the silicon semiconductor device according to the embodiment.
Figure 3B:
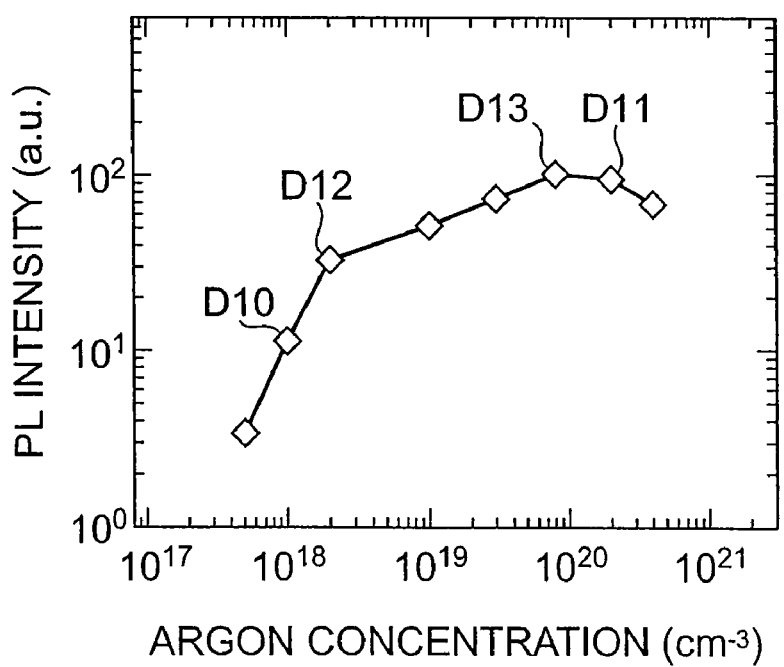

Subsequently, with reference to FIG. 3A, FIG. 3B, FIG. 4A, and FIG. 4B, light-emission characteristics of the silicon semiconductor device 1a manufactured by a method for manufacturing the silicon device according to the above-described first embodiment will be described. FIG. 3A and FIG. 3B show data indicating PL (Photo Luminescence) light-emission characteristics of the silicon semiconductor device 1a. Both the data shown in FIG. 3A and FIG. 3B are measured at room temperature. FIG. 3A shows data (data indicated by reference numeral A1 in the graph) showing a correlation between a wavelength of a PL light emission and a PL intensity in the silicon semiconductor device 1a at an argon concentration of approximately $1 \times 10^{19}$ cm$^{-3}$. FIG. 3A also shows data (data indicated by reference numeral A2 in the graph) showing a correlation between a wavelength of a PL light emission and a PL intensity in the silicon device to which no argon is added. A horizontal axis of the graph shown in FIG. 3A represents a wavelength (nm) of the PL light emission, and a vertical axis thereof represents a PL intensity (arb. units). The PL intensity was measured at room temperature, in which an Nd:YVO4 laser of 532 nm was used as excitation and an infrared photomultiplier (Hamamatsu Photonics R5509-72) was used for detection. According to the data shown in FIG. 3A, the PL intensity (1.13 μm band) of the silicon semiconductor device 1a at an argon concentration of approximately $1 \times 10^{19}$ cm$^{-3}$ increases by 50 times or more than the PL intensity (1.13 g/m band) of the silicon device to which no argon is added. Thus, in the silicon semiconductor device 1a at an argon concentration of approximately $1 \times 10^{19}$ cm$^{-3}$, the PL intensity is significantly improved.

FIG. 3B shows a correlation between an argon concentration of the silicon semiconductor device 1a and a PL intensity in the 1.13 μm band. A horizontal axis of the graph shown in FIG. 3B represents an argon concentration (cm$^{-3}$), and a vertical axis thereof represents a PL intensity (arb. units) in the 1.13 μm band. According to the data shown in FIG. 3B, when the PL intensity in a case where no argon is added is "1" (units), the PL intensity at an argon concentration of $1 \times 10^{18}$ cm$^{-3}$ (see data of reference numeral D10 in the graph) to $2 \times 10^{20}$ cm$^{-3}$ (see data of reference numeral D11 in the graph) increases by 10 times to 100 times or more, as compared to a case where no argon is added. Thus, the PL intensity is significantly improved when the argon concentration is in a range of $1 \times 10^{18}$ cm$^{-3}$ to $2 \times 10^{20}$ cm$^{-3}$.

In particular, the PL intensity at an argon concentration of $2 \times 10^{18}$ cm$^{-3}$ (see data of reference numeral D12 in the graph) to $1 \times 10^{20}$ cm$^{-3}$ (see data of reference numeral D13 in the graph) increases by 30 times to 100 times or more, as compared to a case where no argon is added. Thus, the PL intensity is significantly improved when the argon concentration is in a range of $2 \times 10^{18}$ cm$^{-3}$ to $1 \times 10^{20}$ cm$^{-3}$. When the concentration is within ±50% of the concentration of D13, at least the PL intensity is significantly increased.

Figure 4A:
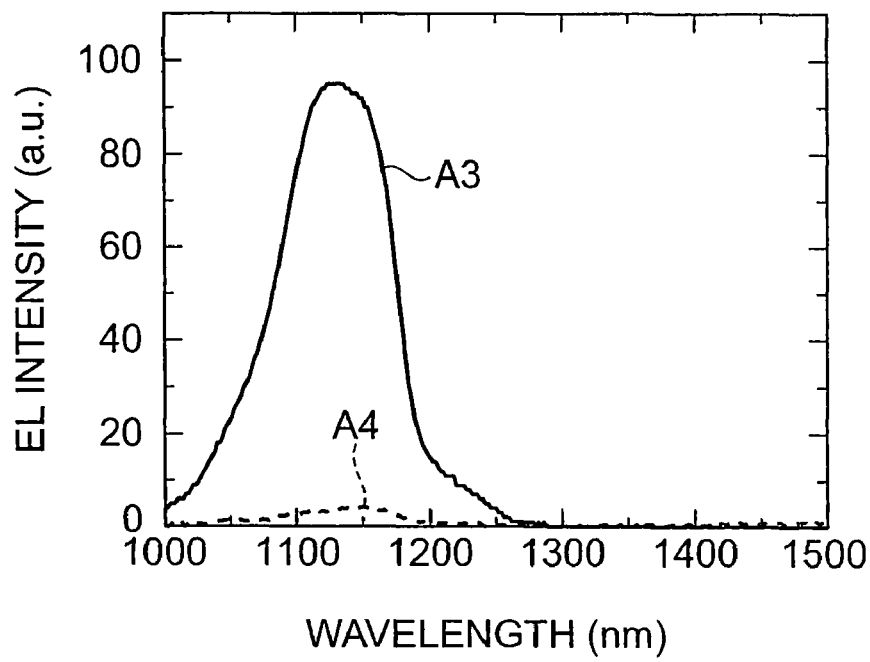
FIG. 4A and FIG. 4B are graphs showing light-emission characteristics of the silicon semiconductor device according to the embodiment.
Figure 4B:
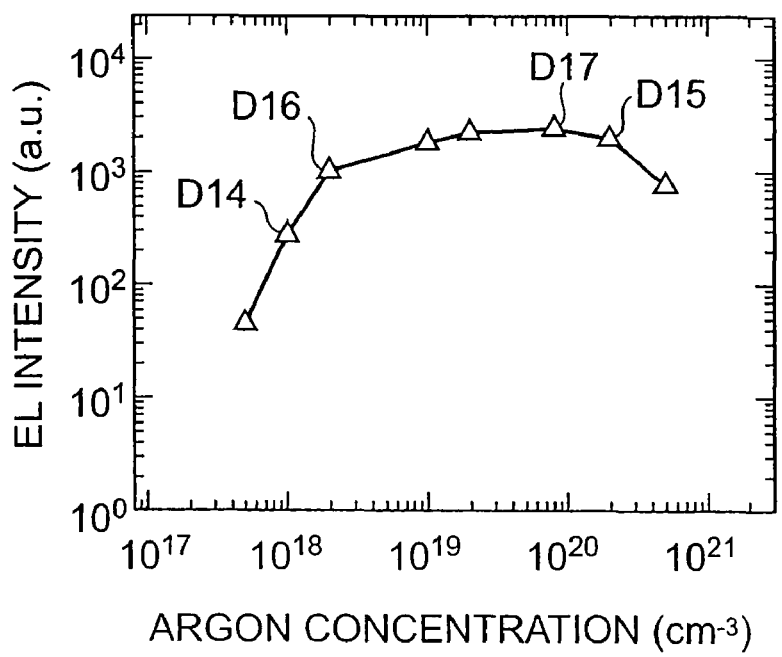

FIG. 4A and FIG. 4B show data indicating EL (Electric Luminescence) light-emission characteristics of the silicon semiconductor device 1a. Both the data shown in FIG. 4A and FIG. 4B are measured at room temperature. FIG. 4A shows data (data indicated by reference numeral A3 in the graph) showing a correlation between a wavelength of an EL light emission and an EL intensity in the silicon semiconductor device 1a at an argon concentration of approximately $2 \times 10^{19}$ cm$^{-3}$. FIG. 4A also shows data (data indicated by reference numeral A4 in the graph, and this data is obtained by magnifying the actual data by 100 times) showing a correlation between a wavelength of an EL light emission and an EL intensity in the silicon device to which no argon is added. A horizontal axis of the graph shown in FIG. 4A represents a wavelength (nm) of the EL light emission, and a vertical axis thereof represents an EL intensity (arb. units). The EL intensity was measured at room temperature, in which a pulse power supply of 100 Hz (implantation current density was 2 A/cm$^{-3}$) was used, and an infrared photomultiplier (Hamamatsu Photonics R5509-72) was used for detection. According to the data shown in FIG. 4A, the EL intensity (1.1 μm band) of the silicon semiconductor device 1a at an argon concentration of approximately $2 \times 10^{19}$ cm$^{-3}$ increases by approximately 2000 times than the EL intensity (in 1.1 μm band) of the silicon device to which no argon is added. Thus, in the silicon semiconductor device 1a at an argon concentration of approximately $2\times10^{19}$ cm$^{-3}$, the EL intensity is significantly improved.

FIG. 4B shows a correlation between an argon concentration of the silicon semiconductor device 1a and an EL intensity in the 1.13 μm band. A horizontal axis of the graph shown in FIG. 4B represents the argon concentration (cm$^{-3}$), and a vertical axis thereof represents the EL intensity (arb. units) in the 1.13 μm band. According to the data shown in FIG. 4B, when the EL intensity in a case where no argon is added is "1" (units), the EL intensity at an argon concentration of $1\times10^{18}$ cm$^{-3}$ (see data of reference numeral D14 in the graph) to $2\times10^{20}$ cm$^{-3}$ (see data of reference numeral D15 in the graph) increases by 200 times to 2000 times or more, as compared to a case where no argon is added. As described above, the EL intensity is significantly improved when the argon concentration is in a range of $1\times10^{18}$ cm$^{-3}$ and $2\times10^{20}$ cm$^{-3}$.

In particular, the EL intensity at an argon concentration of $2\times10^{18}$ cm$^{-3}$ (see data of reference numeral D16 in the graph) to $1\times10^{20}$ cm$^{-3}$ (see data of reference numeral D17 in the graph) increases by 1000 times to 2000 times or more, as compared to a case where no argon is added. When the concentration is within ±50% of the concentration of D17, at least the EL intensity is significantly increased. As described above, the EL intensity is more significantly improved when the argon concentration is in a range of $2\times10^{18}$ cm$^{-3}$ to $1\times10^{20}$ cm$^{-3}$. Therefore, according to the data shown in FIG. 3A, FIG. 3B, FIG. 4A, and FIG. 4B, the argon concentration of the silicon semiconductor device 1a is preferably in a range of $1\times10^{18}$ cm$^{-3}$ to $2\times10^{20}$ cm$^{-3}$, and more preferably in a range of $2\times10^{18}$ cm$^{-3}$ to $1\times10^{20}$ cm$^{-3}$.

Furthermore, the inventor confirms that a response speed of the EL light emission of the silicon semiconductor device 1a at an argon concentration is in a range of $2\times10^{18}$ cm$^{-3}$ to $1\times10^{20}$ cm$^{-3}$ reaches approximately 20 ns from 1 μs or greater, which is approximately 50 times faster as compared to that of the silicon device to which no argon is added.

Second Embodiment

Figure 5A:
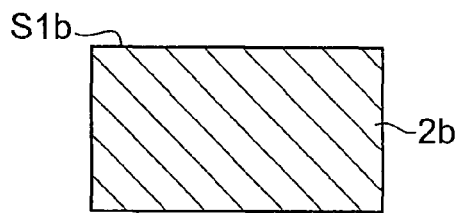
FIG. 5A, FIG. 5B, FIG. 5C, FIG. 5D, and FIG. 5E are cross-sections of a device for describing a method for manufacturing a silicon semiconductor device according to an embodiment.

Subsequently, with reference to FIG. 5A, FIG. 5B, FIG. 5C, FIG. 5D, FIG. 5E, and FIG. F, a method for manufacturing a silicon device according to a second embodiment will be described. The silicon device according to the second embodiment is a silicon semiconductor device 1b. First, a silicon substrate 2b (silicon material) is prepared (FIG. 5A). The silicon substrate 2b includes a first surface S1b and a second surface S2b opposite the first surface S1b.

Figure 5B:
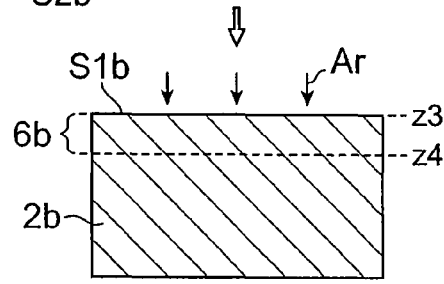

By using the HIP device, the argon is then added from the first surface S1b of the silicon substrate 2b. In this case, the silicon substrate 2b is mounted on a substrate-loading base within the HIP device. The second surface S2b of the silicon substrate 2b is in contact with the surface of the base. The first surface S1b is exposed for 30 minutes to 6 hours to an argon-containing atmosphere which is adjusted to temperatures of 400° C. to 900° C. and pressures of 4 MPa to 200 MPa. Thereby, the argon is added from the first surface S1b. The addition of the argon forms an argon added area 6b (FIG. 5B). Argon adding conditions are: under the argon atmosphere, pressures of 4 MPa to 200 MPa; temperatures of 400° C. to 900° C.; and a processing time of 30 minutes to 6 hours. The argon added area 6b is an area to which argon (Ar) is added, and is formed in a semiconductor area formed of the silicon substrate 2b and a silicon layer 4b. The argon added area 6b is formed from the first surface S1b of the silicon substrate 2b to the inside of the silicon substrate 2b.

Figure 5F:
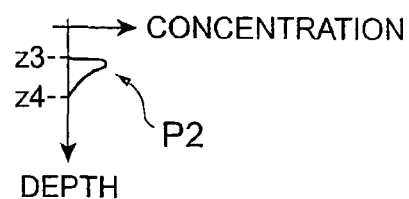
FIG. 5F is a graph showing a concentration distribution in a depth direction.

In FIG. 5F, an argon concentration profile in the argon added area 6b is shown (see reference numeral P2 in the graph). The argon is distributed from a surface depth position z3 of the silicon substrate 2b to a depth position z4 within the silicon substrate 2b. As shown in the argon concentration profile, the argon concentration has its peak in the vicinity of the first surface S1b. The argon added area 6b includes an area indicating an argon concentration of $1\times10^{18}$ cm$^{-3}$ to $2\times10^{20}$ cm$^{-3}$. The argon added area 6a more preferably includes an area indicating an argon concentration of $2\times10^{18}$ cm$^{-3}$ to $1\times10^{20}$ cm$^{-3}$. As a method for adding the argon, any method such as an ion implantation method, a sputtering method, or the like, may be used.

Figure 5C:
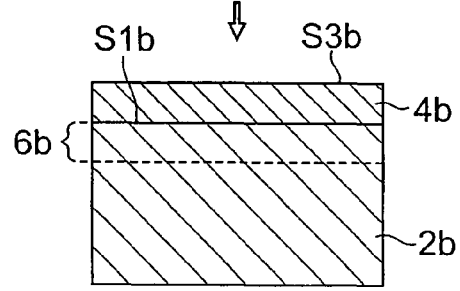
Figure 5D:
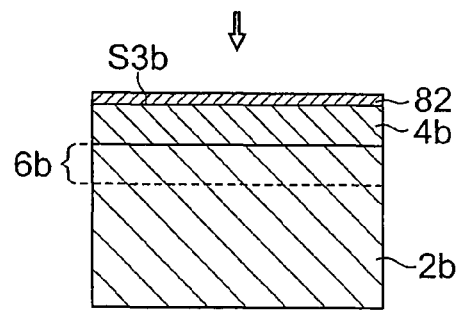
Figure 5E:
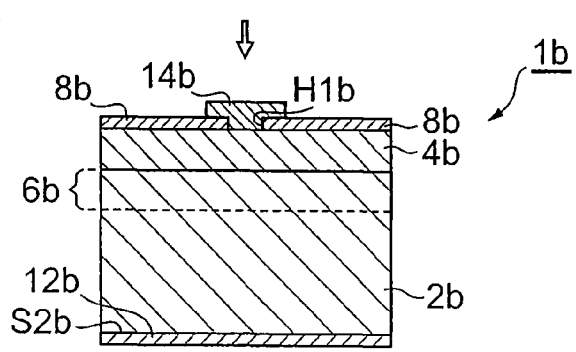

Subsequently, a silicon layer 4b is formed on the first surface S1b of the silicon substrate 2b (FIG. 5C). The silicon layer 4b contains impurities that indicate a second conductivity type different from a first conductivity type. A pn junction portion is formed by the silicon substrate 2b and the silicon layer 4b. The silicon layer 4b includes a third surface S3b opposite a junction surface with the silicon substrate 2b. The thickness of the silicon layer 4b is approximately 50 nm to several μm. In the second embodiment, the first conductivity type is an n-type and the second conductivity type is a p-type. However, the first conductivity type may be the p-type and the second conductivity type may be the n-type. Subsequently, a passivation film 82 is formed on the third surface S3b of the silicon layer 4b (FIG. 5D). A passivation film 8b is a silicon oxide film, for example. Next, a contact hole H1b is arranged in this passivation film 82 to form the passivation film 8b, and a second electrode 14b is formed on the passivation film 8b and a first electrode 12b is formed on the second surface S2b of the silicon substrate 2b. The first electrode 12b and the second electrode 14b are made of a conductive metal (aluminum or the like, for example). Thereafter, through a process such as dicing, the silicon semiconductor device 1b is manufactured (FIG. 5E).

A correlation between argon adding conditions (pressure, temperature, and processing time) and a PL intensity according to the second embodiment is similar to that between the argon adding conditions (pressure, temperature, and processing time) and the PL intensity according to the above-described first embodiment (that is, the correlations shown in FIG. 2A, FIG. 2B, and FIG. 2C). Thus, a description of the correlation between the argon adding conditions (pressure, temperature, and processing time) and the PL intensity according to the second embodiment is omitted. Light-emission characteristics of the silicon semiconductor device 1b manufactured by a method for manufacturing the silicon device according to the above-described second embodiment are similar to those of the silicon semiconductor device 1a according to the above-described first embodiment (that is, the light-emission characteristics shown in FIG. 3A, FIG. 3B, FIG. 4A, and FIG. 4B). Thus, a description of the light-emission characteristics of the silicon semiconductor device 1b is omitted.

Third Embodiment

Figure 6A:
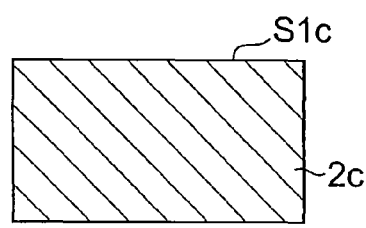
FIG. 6A and FIG. 6B are cross-sections of a device for describing a method for manufacturing a silicon semiconductor device according to an embodiment.
Figure 6A:
Figure 6B:
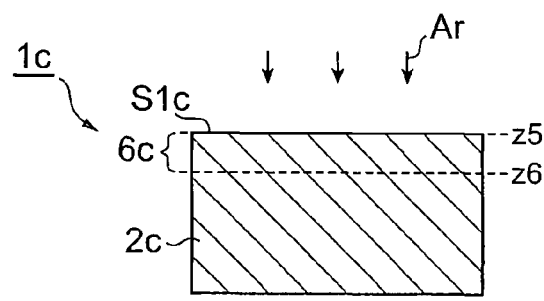

Subsequently, with reference to FIG. 6A, FIG. 6B, and FIG. 6C, a method for manufacturing a silicon device according to a third embodiment will be described. The silicon device according to the third embodiment is a silicon semiconductor device 1c. First, a silicon substrate 2c (silicon material) is prepared (FIG. 6A). The silicon substrate 2c has a first surface S1c.

Subsequently, by using the HIP device, the argon is added from the first surface S1c of the silicon substrate 2c. In this case, the silicon substrate $2c$ is mounted on a substrate-loading base within the HIP device. A surface opposite the first surface $S1c$ of the silicon substrate $2c$ is in contact with the surface of the base. The first surface $S1c$ is exposed for 30 minutes to 6 hours to an argon-containing atmosphere which is adjusted to temperatures of 400° C. to 900° C. and pressures of 4 MPa to 200 MPa. Thereby, the argon is added from the first surface $S1c$. The addition of the argon forms an argon added area $6c$. Argon adding conditions are: under the argon atmosphere, pressures of 4 MPa to 200 MPa; temperatures of 400° C. to 900° C.; and a processing time of 30 minutes to 6 hours. The argon added area $6c$ is an area to which the argon is added within the silicon substrate $2c$. The argon added area $6c$ is formed from the first surface $S1c$ of the silicon substrate $2c$ to the inside of the silicon substrate $2c$.

Figure 6C:
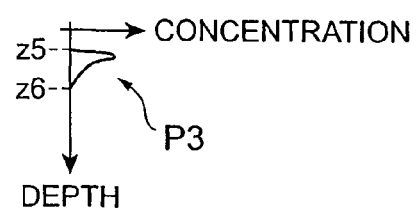
FIG. 6C is a graph showing a concentration distribution in a depth direction.

In FIG. 6C, an argon concentration profile in the argon added area $6c$ is shown (shown by reference numeral P3 in the graph). The argon is distributed from a surface depth position $z5$ of the silicon substrate $2c$ to a depth position $z6$ within the silicon substrate $2c$. As shown in the argon concentration profile, the argon concentration has its peak in the vicinity of the first surface $S1c$. The argon added area $6c$ includes an area indicating an argon concentration of $1 \times 10^{18}$ cm$^{-3}$ to $2 \times 10^{20}$ cm$^{-3}$. The argon added area $6c$ more preferably includes an area indicating an argon concentration of $2 \times 10^{18}$ cm$^{-3}$ to $1 \times 10^{20}$ cm$^{-3}$. As a method for adding the argon, any method such as an ion implantation method, a sputtering method, or the like, may be used. Thereafter, through a process such as dicing, the silicon semiconductor device $1c$ is manufactured (FIG. 6B).

A correlation between the argon adding conditions (pressure, temperature, and processing time) and a PL intensity according to the third embodiment is similar to that between the argon adding conditions (pressure, temperature, and processing time) and the PL intensity according to the above-described first embodiment (that is, the correlation shown in FIG. 2). Thus, a description of the correlation between the argon adding conditions (pressure, temperature, and processing time) and the PL intensity according to the third embodiment is omitted. Light-emission characteristics of the PL light emission of the silicon semiconductor device $1c$ according to the third embodiment is similar to those of the silicon semiconductor device $1a$ according to the above-described first embodiment (that is, the light-emission characteristics shown in FIG. 3A and FIG. 3B). Thus, a description of the light-emission characteristics regarding the PL light emission of the silicon semiconductor device $1c$ is omitted.

Fourth Embodiment

Figure 7A:
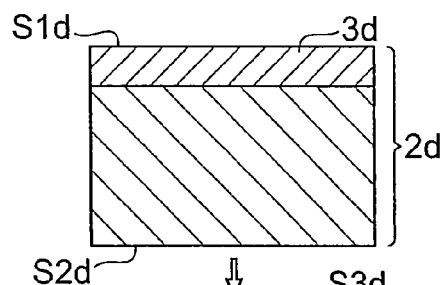
FIG. 7A, FIG. 7B, FIG. 7C, FIG. 7D, and FIG. 7E are cross-sections of a device for describing a method for manufacturing a silicon semiconductor device according to an embodiment.

Subsequently, with reference to FIG. 7A, FIG. 7B, FIG. 7C, FIG. 7D, FIG. 7E, and FIG. 7F, a method for manufacturing a silicon device according to a fourth embodiment will be described. The silicon device according to the fourth embodiment is a silicon semiconductor device $1d$. First, a silicon substrate $2d$ (silicon material) is prepared (FIG. 7A). The silicon substrate $2d$ includes a first surface $S1d$ and a second surface $S2d$ opposite the first surface $S1d$. The silicon substrate $2d$ includes a silicon area $3d$. The silicon area $3d$ is arranged so as to have a thickness inwardly from the first surface $S1d$ of the silicon substrate $2d$. The silicon area $3d$ is an impurity layer that contains impurities indicating a first conductivity type, and is configured of either one of porous silicon or beta iron silicide ($\beta$-FeSi$_2$). The remaining area of the silicon substrate $2d$, other than the silicon area $3d$, is formed of single crystal silicon, for example.

Figure 7B:
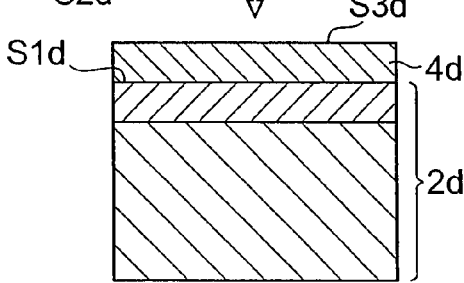

Subsequently, a silicon layer $4d$ is formed on the first surface $S1d$ of the silicon substrate $2d$ (FIG. 7B). The silicon layer $4d$ contains impurities that indicate a second conductivity type different from the first conductivity type. A pn junction portion is formed by the silicon substrate $2d$ (in particular, the silicon area $3d$) and the silicon layer $4d$. The silicon layer $4d$ includes a third surface $S3d$ opposite a junction surface with the silicon substrate $2d$. The thickness of the silicon layer $4d$ is approximately 50 nm to several μm. In the fourth embodiment, when the silicon area $3d$ is configured of the porous silicon, the first conductivity type is a p-type and the second conductivity type is an n-type; and, when the silicon area $3d$ is configured of the beta iron silicide, the first conductivity type is the n-type and the second conductivity type is the p-type. On the other hand, when the silicon area $3d$ is configured of the porous silicon, it may be possible that the first conductivity type is the n-type and the second conductivity type is the p-type; and when the silicon area $3d$ is configured of the beta iron silicide, it may be possible that the first conductivity type is the p-type and the second conductivity type is the n-type.

Figure 7C:
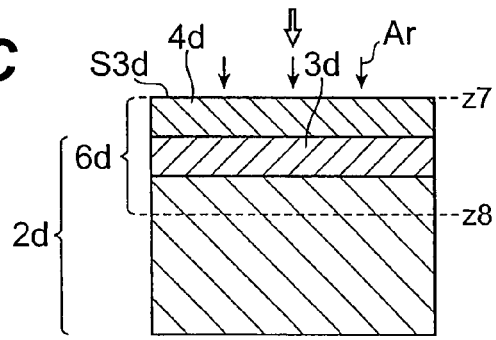

By using the HIP device, the argon is then added from the third surface $S3d$ of the silicon layer $4d$. In this case, the silicon substrate $2d$ is mounted on a substrate-loading base within the HIP device. The second surface $S2d$ of the silicon substrate $2d$ is in contact with the surface of the base. The third surface $S3d$ is exposed for 30 minutes to 6 hours to an argon-containing atmosphere which is adjusted to temperatures of 400° C. to 900° C. and pressures of 4 MPa to 200 MPa. Thereby, the argon is added from the third surface $S3d$. The addition of the argon forms an argon added area $6d$ (FIG. 7C). Argon adding conditions are: under the argon atmosphere, pressures of 4 MPa to 200 MPa; temperatures of 400° C. to 900° C.; and a processing time of 30 minutes to 6 hours. The argon added area $6d$ is an area to which the argon is added, and is formed in a semiconductor area formed of the silicon substrate $2d$ and the silicon layer $4d$. The argon added area $6d$ is formed from the third surface $S3d$ of the silicon layer $4d$ to the inside of the above-described semiconductor area.

Figure 7F:
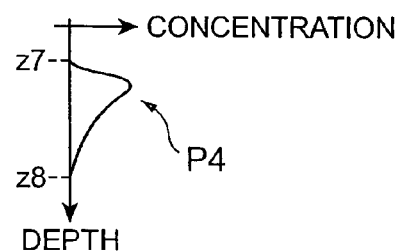
FIG. 7F is a graph showing a concentration distribution in a depth direction.

In FIG. 7F, an argon concentration profile in the argon added area $6d$ is shown (shown by reference numeral P4 in the graph). The argon is distributed from a surface depth position $z7$ of the silicon layer $4d$ to a depth position $z8$ that is deeper than the silicon area $3d$ within the silicon substrate $2d$.

As shown by reference numeral P4 in the graph, the argon concentration has its peak in the vicinity of the third surface $S3d$. In an example shown in the argon concentration profile, the argon added area $6d$ ranges from the third surface $S3d$ of the silicon layer $4d$, including the silicon layer $4d$ and the silicon area $3d$, to the interior of the silicon substrate $2d$. The argon added area $6d$ in a case where the silicon area $3d$ is configured of the porous silicon includes an area that indicates an argon concentration of $1 \times 10^{18}$ cm$^{-3}$ to $2 \times 10^{20}$ cm$^{-3}$. The argon added area $6d$ more preferably includes an area indicating an argon concentration of $2 \times 10^{18}$ cm$^{-3}$ to $1 \times 10^{20}$ cm$^{-3}$. The argon added area $6d$ in a case where the silicon area $3d$ is configured of the beta iron silicide includes an area that indicates an argon concentration of $1 \times 10^{18}$ cm$^{-3}$ to $1 \times 10^{20}$ cm$^{-3}$. The argon added area $6d$ more preferably includes an area indicating an argon concentration of $2 \times 10^{18}$ cm$^{-3}$ to $1 \times 10^{20}$ cm$^{-3}$. As a method for adding the argon, any method such as an ion implantation method, a sputtering method, or the like, may be used.

Figure 7D:
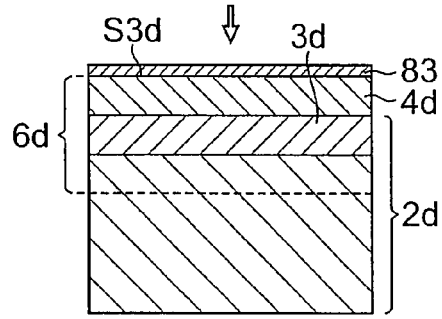
Figure 7E:
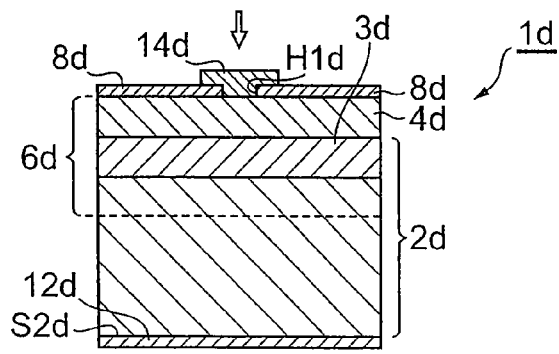

Subsequently, a passivation film 83 is formed on the third surface $S3d$ of the silicon layer $4d$ (FIG. 7D). A passivation film $8d$ is a silicon oxide film, for example. Next, a contact hole H1*d* is arranged in this passivation film 83 to form the passivation film 8*d*, and a second electrode 14*d* is formed on the passivation film 8*d* and a first electrode 12*d* is formed on the second surface S2*d* of the silicon substrate 2*d*. The first electrode 12*a* and the second electrode 14*a* are made of a conductive metal (aluminum or the like, for example). Thereafter, through a process such as dicing, the silicon semiconductor device 1*d* is manufactured (FIG. 7E).

A correlation between argon adding conditions (pressure, temperature, and processing time) and a PL intensity according to the fourth embodiment is similar to that between the argon adding conditions (pressure, temperature, and processing time) and the PL intensity according to the above-described first embodiment (that is, the correlations shown in FIG. 2A, FIG. 2B, and FIG. 2C). Thus, a description of the correlation between the argon adding conditions (pressure, temperature, and processing time) and the PL intensity according to the fourth embodiment is omitted.

Figure 8A:
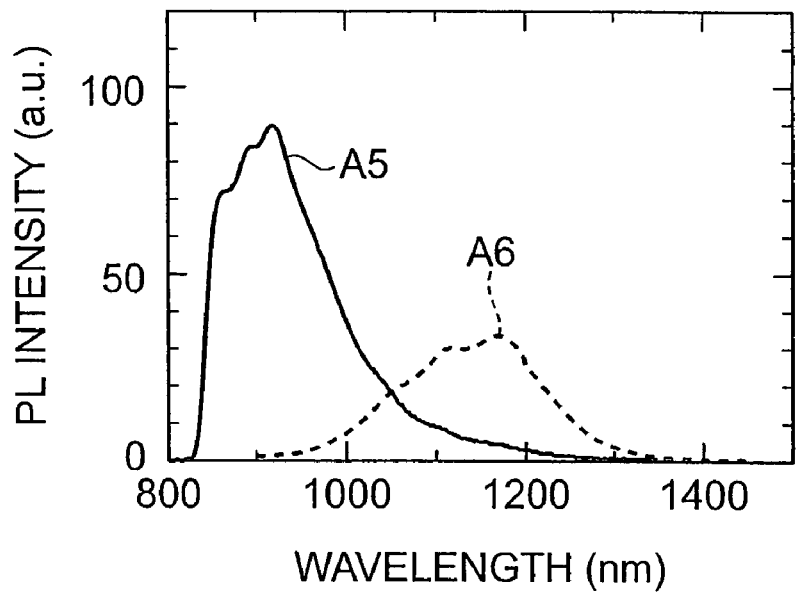
FIG. 8A and FIG. 8B are graphs showing light-emission characteristics of the silicon semiconductor device according to the embodiment.
Figure 8B:
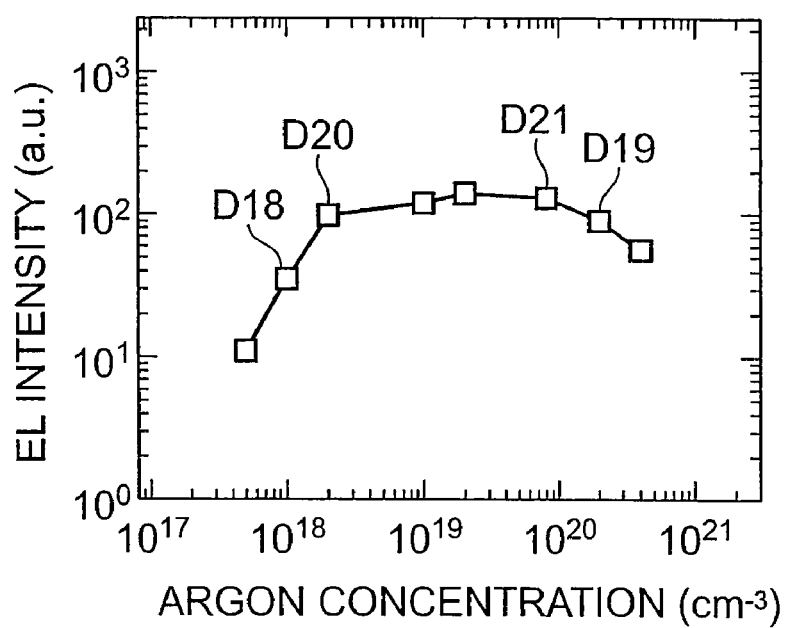

Subsequently, with reference to FIG. 8A, FIG. 8B, FIG. 9A, and FIG. 9B, light-emission characteristics of the silicon semiconductor device 1*d* manufactured by a method for manufacturing the silicon device according to the above-described fourth embodiment will be described. FIG. 8A shows data indicating PL light-emission characteristics of the silicon semiconductor device 1*d* having a silicon area 3*d* configured of the porous silicon, and FIG. 8B shows data indicating EL light-emission characteristics of the silicon semiconductor device 1*d* having a silicon area 3*d* configured of the porous silicon. Both the data shown in FIG. 8A and FIG. 8B are measured at room temperature. FIG. 8A shows data (data indicated by reference numeral A5 in the graph) indicating a correlation between a wavelength of the PL light emission and a PL intensity in the silicon semiconductor device 1*d* at an argon concentration of approximately $1 \times 10^{19}$ cm$^{-3}$. FIG. 8A also shows data (data indicated by reference numeral A6 in the graph, and this data is obtained by magnifying the actual data by 50 times) indicating a correlation between a wavelength of a PL light emission and a PL intensity in the silicon device to which no argon is added. A horizontal axis of the graph shown in FIG. 8A represents a wavelength (nm) of the PL light emission, and a vertical axis thereof represents a PL intensity (arb. units). According to the data shown in FIG. 8A, the PL intensity (0.92 μm band) of the silicon semiconductor device 1*d* at an argon concentration of approximately $1 \times 10^{19}$ cm$^{-3}$ increases by 100 times or more than the PL intensity (0.92 μm band) of the silicon device to which no argon is added. As described above, in the silicon semiconductor device 1*d* at an argon concentration of approximately $1 \times 10^{19}$ cm$^{-3}$, the PL intensity is significantly improved.

In the silicon device to which no argon is added, a peak of the PL light emission is approximately 1150 nm. On the other hand, in the silicon semiconductor device 1*d* at an argon concentration of approximately $1 \times 10^{19}$ cm$^{-3}$, the peak shifts to approximately 922 nm.

FIG. 8B shows a correlation between the argon concentration of the silicon semiconductor device 1*d* and a EL intensity in a 922 nm band. A horizontal axis of the graph shown in FIG. 8B represents an argon concentration (cm$^{-3}$), and a vertical axis thereof represents an EL intensity (arb. units). According to the data shown in FIG. 8B, when the EL intensity in a case where no argon is added is "1" (units), the EL intensity at an argon concentration of $1 \times 10^{18}$ cm$^{-3}$ (see data of reference numeral D18 in the graph) to $2 \times 10^{20}$ cm$^{-3}$ (see data of reference numeral D19 in the graph) increases by 30 times to 100 times or more, as compared to a case where no argon is added. As described above, the EL intensity is significantly improved when the argon concentration is in a range of $1 \times 10^{18}$ cm$^{-3}$ and $2 \times 10^{20}$ cm$^{-3}$.

In particular, the EL intensity at an argon concentration of $2 \times 10^{18}$ cm$^{-3}$ (see data of reference numeral D20 in the graph) to $8 \times 10^{19}$ cm$^{-3}$ (see data of reference numeral D21 in the graph) increases by 100 times or more, as compared to a case where no argon is added. When the concentration is within ±50% of the concentration of D21, at least the EL intensity is significantly increased. As described above, the EL intensity is significantly improved when the argon concentration is in a range of $2 \times 10^{18}$ cm$^{-3}$ to $8 \times 10^{19}$ cm$^{-3}$. Therefore, the argon concentration of the silicon semiconductor device 1*d* in which the porous silicon is used is preferably in a range of $1 \times 10^{18}$ cm$^{-3}$ to $2 \times 10^{20}$ cm$^{-3}$, and more preferably in a range of $2 \times 10^{18}$ cm$^{-3}$ to $8 \times 10^{19}$ cm$^{-3}$.

Figure 9A:
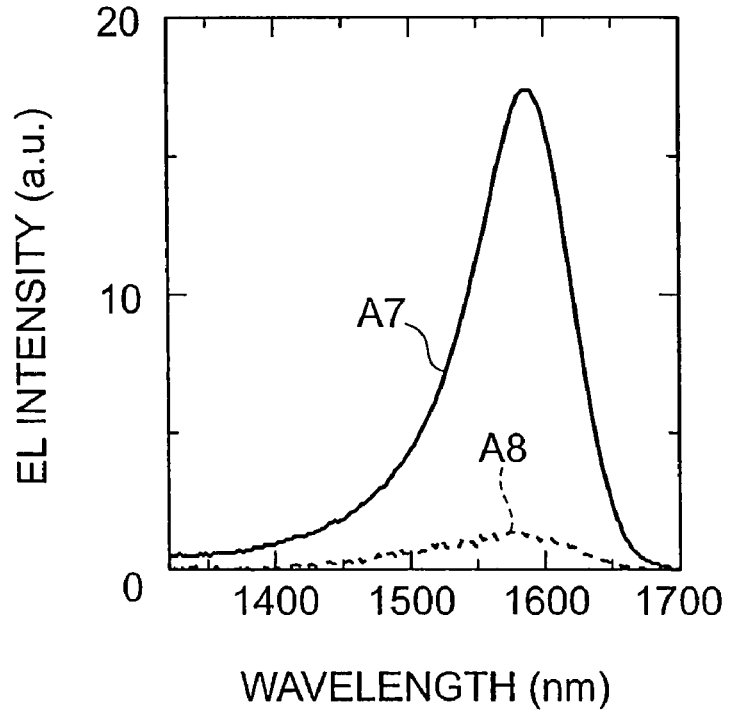
FIG. 9A and FIG. 9B are graphs showing light-emission characteristics of the silicon semiconductor device according to the embodiment.
Figure 9B:
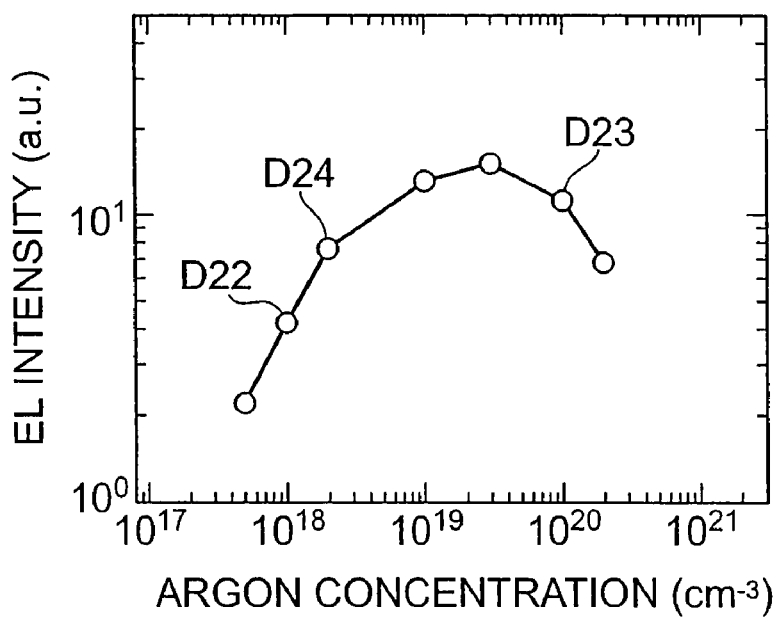

FIG. 9A and FIG. 9B show data indicating EL (Electric Luminescence) light-emission characteristics of the silicon semiconductor device 1*d* having a silicon area 3*d* configured of the beta iron silicide. Both the data shown in FIG. 9A and FIG. 9B are measured at room temperature. FIG. 9A shows data (data indicated by reference numeral A7 in the graph) showing a correlation between a wavelength of an EL light emission and an EL intensity in the silicon semiconductor device 1*d* at an argon concentration of approximately $1 \times 10^{19}$ cm$^{-3}$. FIG. 9A also shows data (data indicated by reference numeral A8 in the graph) showing a correlation between a wavelength of an EL light emission and an EL intensity in the silicon device to which no argon is added. A horizontal axis of the graph shown in FIG. 9A represents a wavelength (nm) of the EL light emission, and a vertical axis thereof represents an EL intensity (arb. units). According to the data shown in FIG. 9A, the EL intensity (1.6 μm band) of the silicon semiconductor device 1*d* at an argon concentration of approximately $1 \times 10^{19}$ cm$^{-3}$ increases by approximately 15 times than the EL intensity (1.6 μm band) of the silicon device to which no argon is added. As described above, in the silicon semiconductor device 1*d* at an argon concentration of approximately $1 \times 10^{19}$ cm$^{-3}$, the EL intensity is significantly improved.

FIG. 9B shows a correlation between an argon concentration of the silicon semiconductor device 1*d* and an EL intensity in a 1.6 μm band. A horizontal axis of the graph shown in FIG. 9B represents an argon concentration (cm$^{-3}$), and a vertical axis thereof represents an EL intensity (arb. units) in the 1.6 μm band. According to the data shown in FIG. 9B, when the EL intensity in a case where no argon is added is "1" (units), the EL intensity at an argon concentration of $1 \times 10^{18}$ cm$^{-3}$ (see data of reference numeral D22 in the graph) to $1 \times 10^{20}$ cm$^{-3}$ (see data of reference numeral D23 in the graph) increases by 4 times to 15 times or more, as compared to a case where no argon is added. As described above, the EL intensity is significantly improved when the argon concentration is in a range of $1 \times 10^{18}$ cm$^{-3}$ to $1 \times 10^{20}$ cm$^{-3}$.

In particular, the EL intensity at an argon concentration of $2 \times 10^{18}$ cm$^{-3}$ (see data of reference numeral D24 in the graph) to $1 \times 10^{20}$ cm$^{-3}$ (see data of reference numeral D23 in the graph) increases by 6 times to 15 times or more, as compared to a case where no argon is added. When the concentration is within ±50% of the concentration of $3 \times 10^{19}$, at least the EL intensity is significantly increased. As described above, the EL intensity is more significantly improved when the argon concentration is in a range of $2 \times 10^{18}$ cm$^{-3}$ to $1 \times 10^{20}$ cm$^{-3}$. Therefore, the argon concentration of the silicon semiconductor device 1*d* including the beta iron silicide is preferably in a range of $1\times10^{18}$ cm$^{-3}$ to $1\times10^{20}$ cm$^{-3}$, and more preferably in a range of $2\times10^{18}$ cm$^{-3}$ to $1\times10^{20}$ cm$^{-3}$.

Fifth Embodiment

Figure 10A:
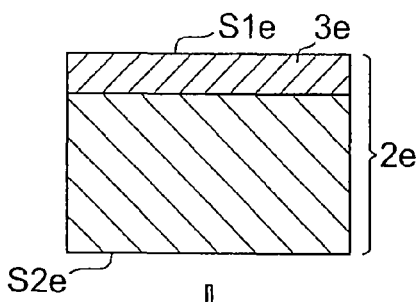
FIG. 10A, FIG. 10B, FIG. 10C, FIG. 10D, and FIG. 10E are cross-sections of a device for describing a method for manufacturing a silicon semiconductor device according to an embodiment.

Subsequently, with reference to FIG. 10A, FIG. 10B, FIG. 10C, FIG. 10D, FIG. 10E, and FIG. 10F, a method for manufacturing a silicon device according to a fifth embodiment will be described. The silicon device according to the fifth embodiment is a silicon semiconductor device 1e. First, a silicon substrate 2e (silicon material) is prepared (FIG. 10A). The silicon substrate 2e includes a first surface S1e and a second surface S2e opposite the first surface S1e. The silicon substrate 2e includes a silicon area 3e. The silicon area 3e is arranged so as to have a thickness inwardly from the first surface S1e of the silicon substrate 2e. The silicon area 3e is an impurity layer that contains impurities indicating a first conductivity type, and is configured of either one of porous silicon or beta iron silicide ($\beta$-FeSi$_2$). The remaining area of the silicon substrate 2e, other than the silicon area 3e, is formed of single crystal silicon, for example.

Figure 10B:
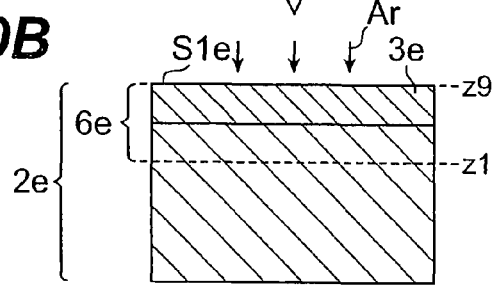

Subsequently, by using the HIP device, the argon is added from the first surface S1e of the silicon substrate 2e. In this case, the silicon substrate 2e is mounted on a substrate-loading base within the HIP device. The second surface S2e of the silicon substrate 2e is in contact with the surface of the base. The first surface S1e is exposed for 30 minutes to 6 hours to an argon-containing atmosphere which is adjusted to temperatures of 400° C. to 900° C. and pressures of 4 MPa to 200 MPa. Thereby, the argon is added from the first surface S1e. The addition of the argon forms an argon added area 6e (FIG. 10B). Argon adding conditions are: under the argon atmosphere, pressures of 4 MPa to 200 MPa; temperatures of 400° C. to 900° C.; and a processing time of 30 minutes to 6 hours. The argon added area 6e is an area to which the argon is added, and is formed in a semiconductor area formed of the silicon substrate 2e and the silicon layer 4e. The argon added area 6e is formed from the first surface S1e of the silicon substrate 2e to the inside of the silicon substrate 2e.

Figure 10F:
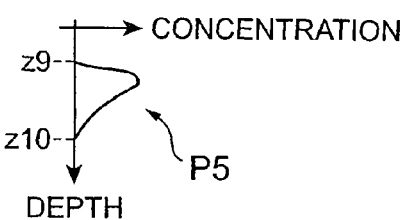
FIG. 10F is a graph showing a concentration distribution in a depth direction.

In FIG. 10F, an argon concentration profile in the argon added area 6e is shown (shown by reference numeral P5 in the graph). The argon is distributed from an exposed-surface position z9 of the silicon area 3e to a depth position z10 that is deeper than the silicon area 3e within the silicon substrate 2e. As shown in the argon concentration profile, the argon concentration has its peak in the vicinity of the first surface S1e. In an example shown in the argon concentration profile, the argon added area 6e ranges from the first surface S1e of the silicon substrate 2e, including the silicon area 3e, to the interior of the silicon substrate 2e. An argon added area 6e in a case where the silicon area 3e is configured of the porous silicon includes an area that indicates an argon concentration of $1\times10^{18}$ cm$^{-3}$ to $2\times10^{20}$ cm$^{-3}$. The argon added area 6e preferably includes an area indicating an argon concentration of $2\times10^{18}$ cm$^{-3}$ to $1\times10^{20}$ cm$^{-3}$. An argon added area 6e in a case where the silicon area 3e is configured of the beta iron silicide includes an area that indicates an argon concentration of $1\times10^{18}$ cm$^{-3}$ to $1\times10^{20}$ cm$^{-3}$. The argon added area 6e more preferably includes an area indicating an argon concentration of $2\times10^{18}$ cm$^{-3}$ to $1\times10^{20}$ cm$^{-3}$. As a method for adding the argon, any method such as an ion implantation method, a sputtering method, or the like, may be used.

Figure 10C:
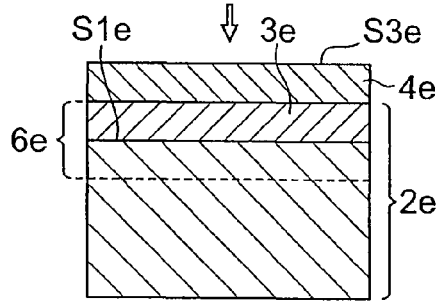
Figure 10D:
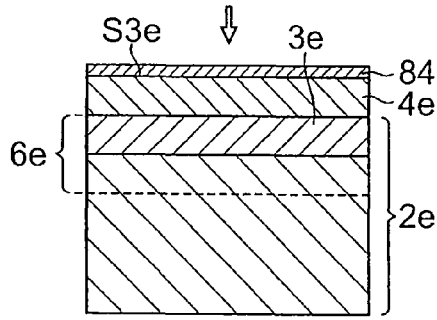
Figure 10E:
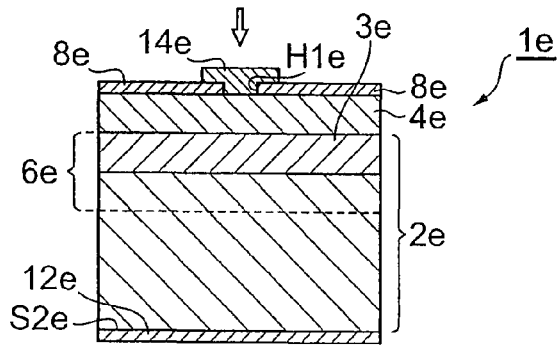

Subsequently, a silicon layer 4e is formed on the first surface S1e of the silicon substrate 2e (FIG. 10C). The silicon layer 4e contains impurities that indicate a second conductivity type different from a first conductivity type. A pn junction portion is formed by the silicon substrate 2e (in particular, the silicon area 3e) and the silicon layer 4e. The silicon layer 4e includes a third surface S3e opposite a junction surface with the silicon substrate 2e. The thickness of the silicon layer 4e is approximately 50 nm to several μm. In the fifth embodiment, when the silicon area 3e is configured of the porous silicon, the first conductivity type is a p-type and the second conductivity type is an n-type; and when the silicon area 3e is configured of the beta iron silicide, the first conductivity type is the n-type and the second conductivity type is the p-type. On the other hand, when the silicon area 3e is configured of the porous silicon, it may be possible that the first conductivity type is the n-type and the second conductivity type is the p-type; and when the silicon area 3e is configured of the beta iron silicide, it may be possible that the first conductivity type is the p-type and the second conductivity type is the n-type. Subsequently, a passivation film 84 is formed on the third surface S3e of the silicon layer 4e (FIG. 10D). A passivation film 8e is a silicon oxide film, for example. Next, a contact hole H1e is arranged in this passivation film 84 to form the passivation film 8e, and a second electrode 14e is formed on the passivation film 8e and a first electrode 12e is formed on the second surface S2e of the silicon substrate 2e. The first electrode 12e and the second electrode 14e are made of a conductive metal (aluminum or the like, for example). Thereafter, through a process such as dicing, the silicon semiconductor device 1e is manufactured (FIG. 10E).

A correlation between argon adding conditions (pressure, temperature, and processing time) and a PL intensity according to the fifth embodiment is similar to that between the argon adding conditions (pressure, temperature, and processing time) and the PL intensity according to the above-described first embodiment (that is, the correlations shown in FIG. 2A, FIG. 2B, and FIG. 2C). Thus, a description of the correlation between the argon adding conditions (pressure, temperature, and processing time) and the PL intensity according to the fifth embodiment is omitted. Light-emission characteristics of the silicon semiconductor device 1e according to the fifth embodiment are similar to those shown in FIG. 8A and FIG. 8B when the silicon area 3e is configured of the porous silicon, and similar to those shown in FIG. 9A and FIG. 9B when the silicon area 3e is configured of the beta iron silicide. Thus, a description of the light-emission characteristics of the silicon semiconductor device 1e is omitted.

Sixth Embodiment

Figure 11A:
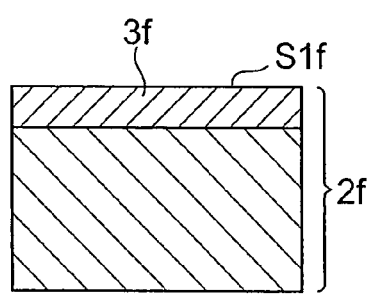
FIG. 11A and FIG. 11B are cross-sections of a device for describing a method for manufacturing a silicon semiconductor device according to an embodiment.
Figure 11B:
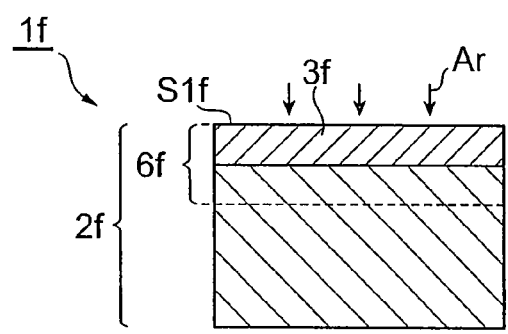

Subsequently, with reference to FIG. 11A, FIG. 11B, and FIG. 11C, a method for manufacturing a silicon device according to a sixth embodiment will be described. The silicon device according to the sixth embodiment is a silicon semiconductor device 1f. First, a silicon substrate 2f (silicon material) is prepared (FIG. 11A). The silicon substrate 2f includes a first surface S1f and a silicon area 3f. The silicon area 3f is arranged so as to have a thickness inwardly from the first surface S1f of the silicon substrate 2f. The silicon area 3f is configured of either one of porous silicon or beta iron silicide ($\beta$-FeSi$_2$). The remaining area of the silicon substrate 2f, other than the silicon area 3f, is formed of single crystal silicon, for example.

Subsequently, by using the HIP device, the argon is added from the first surface S1f of the silicon substrate 2f. In this case, the silicon substrate 2f is mounted on a substrate-loading base within the HIP device. A surface opposite the first surface S1f of the silicon substrate 2f is in contact with the surface of the base. The first surface S1f is exposed for 30 minutes to 6 hours to an argon-containing atmosphere which is adjusted to temperatures of 400° C. to 900° C. and pressures of 4 MPa to 200 MPa. Thereby, the argon is added from the first surface S1f. The addition of the argon forms an argon added area 6f. Argon adding conditions are: under the argon atmosphere, pressures of 4 MPa to 200 MPa; temperatures of 400° C. to 900° C.; and a processing time of 30 minutes to 6 hours. The argon added area 6f is an area to which the argon is added within the silicon substrate 2f. The argon added area 6f is formed from the first surface S1f of the silicon substrate 2f to the inside of the silicon substrate 2f.

Figure 11C:
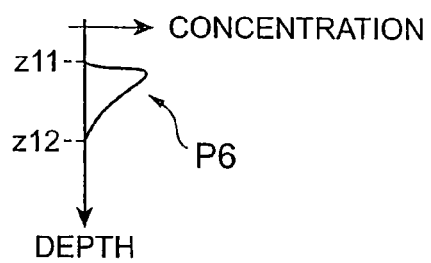
FIG. 11C is a graph showing a concentration distribution in a depth direction.

In FIG. 11C, an argon concentration profile in the argon added area 6f is shown (shown by reference numeral P6 in the graph). The argon is distributed from an exposed-surface position z11 of the silicon area 3f to a depth position z12 that is deeper than the silicon area 3f within the silicon substrate 2f. As shown in the argon concentration profile, the argon concentration has its peak in the vicinity of the first surface S1f. The argon added area 6f in a case where the silicon area 3f is configured of the porous silicon includes an area that indicates an argon concentration of $1\times10^{18}$ cm$^{-3}$ to $2\times10^{20}$ cm$^{-3}$. The argon added area 6f more preferably includes an area indicating an argon concentration of $2\times10^{18}$ cm$^{-3}$ to $1\times10^{20}$ cm$^{-3}$. The argon added area 6f in a case where the silicon area 3f is configured of the beta iron silicide includes an area indicating an argon concentration of $1\times10^{18}$ cm$^{-3}$ to $1\times10^{20}$ cm$^{-3}$. The argon added area 6f more preferably includes an area indicating an argon concentration of $2\times10^{18}$ cm$^{-3}$ to $1\times10^{20}$ cm$^{-3}$. As a method for adding the argon, any method such as an ion implantation method, a sputtering method, or the like, may be used. Thereafter, through a process such as dicing, the silicon semiconductor device 1f is manufactured (FIG. 11B).

A correlation between argon adding conditions (pressure, temperature, and processing time) and a PL intensity according to the sixth embodiment is similar to that between the argon adding conditions (pressure, temperature, and processing time) and the PL intensity according to the above-described first embodiment (that is, the correlations shown in FIG. 2A, FIG. 2B, and FIG. 2C). Thus, a description of the correlation between the argon adding conditions (pressure, temperature, and processing time) and the PL intensity according to the sixth embodiment is omitted. Light-emission characteristics of the silicon semiconductor device 1f according to the sixth embodiment are similar to those shown in FIG. 8A and FIG. 8B when the silicon area 3f is configured of the porous silicon, and similar to those shown in FIG. 9A and FIG. 9B when the silicon area 3f is configured of the beta iron silicide. Thus, a description of the light-emission characteristics of the silicon semiconductor device 1f is omitted.

In the above-described descriptions, "approximately" of each parameter means to include an error within ±30%, and preferably means to include an error within ±10%.

What is claimed is:

1. A method for manufacturing a silicon device, comprising steps of:
   (a) forming a layer comprised of silicon having a second conductivity type on a surface of a silicon material having a first conductivity type; and
   (b) exposing, after step (a), a surface of the silicon layer for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa,
   wherein the silicon material includes a silicon area arranged on the surface of the silicon material and having a thickness inwardly of the silicon material from the surface, and the silicon area is formed of $\beta$-FeSi$_2$.

2. A method for manufacturing a silicon device, comprising steps of:
   (a) exposing a surface of a silicon material having a first conductivity type for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa; and
   (b) forming, after step (a), a layer comprised of silicon having a second conductivity type on the surface of the silicon material,
   wherein the silicon material includes a silicon area arranged on the surface of the silicon material and having a thickness inwardly of the silicon material from the surface, and the silicon area is formed of $\beta$-FeSi$_2$.

3. A method for manufacturing a silicon device comprising a step of exposing a surface of a silicon material for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa,
   wherein the silicon material includes a silicon area arranged on the surface of the silicon material and having a thickness inwardly of the silicon material from the surface, and the silicon area is formed of $\beta$-FeSi$_2$; and
   the conductivity type of the silicon material is different from that of the silicon area.

4. A method for manufacturing a silicon device, comprising steps of:
   (a) forming a layer comprised of silicon having a second conductivity type on a surface of a silicon material that indicates a first conductivity type; and
   (b) exposing, after the step (a), a surface of the silicon layer for a period of a minimum of 30 minutes and a maximum of 6 hours to an argon-containing atmosphere which is adjusted to temperatures of a minimum of 400° C. and a maximum of 900° C. and pressures of minimum of 4 MPa and a maximum of 200 MPa,
   wherein
   the silicon material includes a silicon area arranged on the surface of the silicon material and having a thickness inwardly of the silicon material from the surface, and
   a remaining area other than the silicon area of the silicon material is formed of single crystal silicon.

5. A method for manufacturing a silicon device, comprising steps of:
   (a) exposing a surface of a silicon material that indicates a first conductivity type for a period of a minimum of 30 minutes and a maximum of 6 hours to an argon-containing atmosphere which is adjusted to temperatures of a minimum of 400° C. and a maximum of 900° C. and pressures of a minimum of 4 MPa and a maximum of 200 MPa; and
   (b) forming, after the step (a), a layer comprised of silicon having a second conductivity type on the surface of the silicon material,
   wherein
   the silicon material includes a silicon area arranged on the surface of the silicon material and having a thickness inwardly of the silicon material from the surface, and
   a remaining area other than the silicon area of the silicon material is formed of single crystal silicon.

* * * * *